(12) United States Patent
Willer

(10) Patent No.: US 7,256,098 B2
(45) Date of Patent: Aug. 14, 2007

(54) METHOD OF MANUFACTURING A MEMORY DEVICE

(75) Inventor: Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 118 days.

(21) Appl. No.: 11/103,244

(22) Filed: Apr. 11, 2005

(65) Prior Publication Data
US 2006/0228859 A1 Oct. 12, 2006

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 438/381; 438/238; 438/257; 257/E21; 257/17; 257/422; 257/646; 257/E27; 257/84

(58) Field of Classification Search ................. 438/381, 438/238, 257, 270, 229, 299, 263, 264, 637, 438/675, 680, 700, 712, 954
See application file for complete search history.

(56) References Cited

U.S. PATENT DOCUMENTS

| | | | | |
|---|---|---|---|---|
| 6,023,085 A | * | 2/2000 | Fang | 257/315 |
| 6,118,159 A | * | 9/2000 | Willer et al. | 257/390 |
| 6,853,029 B2 | * | 2/2005 | Ichige et al. | 257/316 |
| 6,979,857 B2 | * | 12/2005 | Forbes | 257/314 |
| 7,087,950 B2 | * | 8/2006 | Willer et al. | 257/314 |
| 2002/0102793 A1 | * | 8/2002 | Wu | 438/257 |
| 2002/0115256 A1 | | 8/2002 | Lee et al. | 438/253 |
| 2004/0207038 A1 | * | 10/2004 | Hofmann et al | 257/500 |
| 2005/0180186 A1 | * | 8/2005 | Lutze et al. | 365/53 |

* cited by examiner

Primary Examiner—David Nhu
(74) Attorney, Agent, or Firm—Dicke, Billig, & Czaja, PLLC

(57) ABSTRACT

A method of making a memory device and a memory device is described. In one embodiment, a method of manufacturing a memory device is described. The method includes providing a substrate having a tunneling layer deposited on a main surface and having a first conductive lines arranged on the tunneling layer running in a first direction. A layer of dielectric material is deposited on the first conductive lines. A control gate layer is deposited. The first conductive lines are patterned to produce gate stacks. Dielectric material is deposited in between the gate stacks. The gate stacks are partially removed to uncover floating gate electrodes in region of selection transistor lines to be prepared creating selection transistor line recesses running in the second direction. The selection transistor line recesses are filled with a conductive material to create the selection transistor lines.

18 Claims, 12 Drawing Sheets

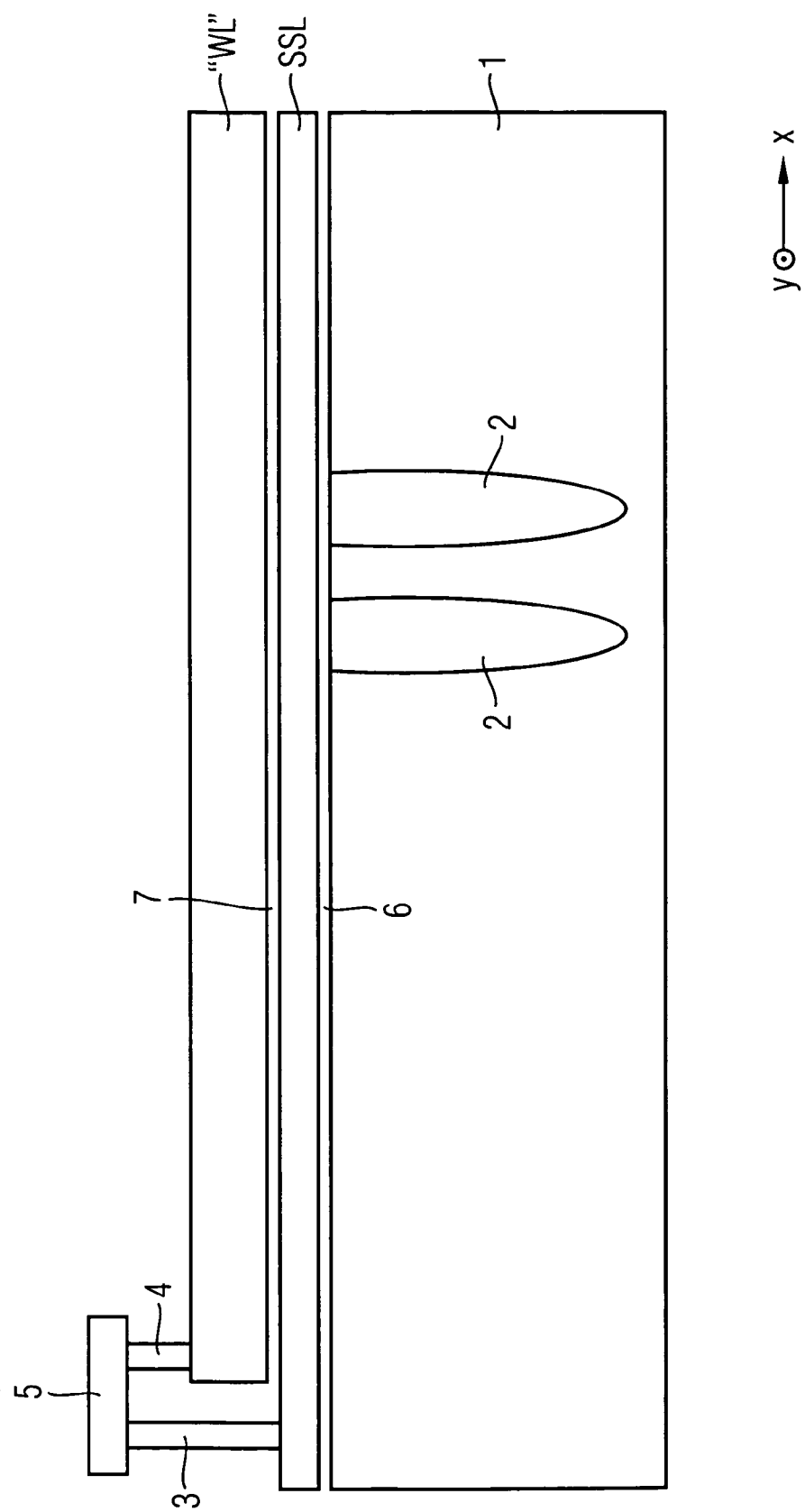

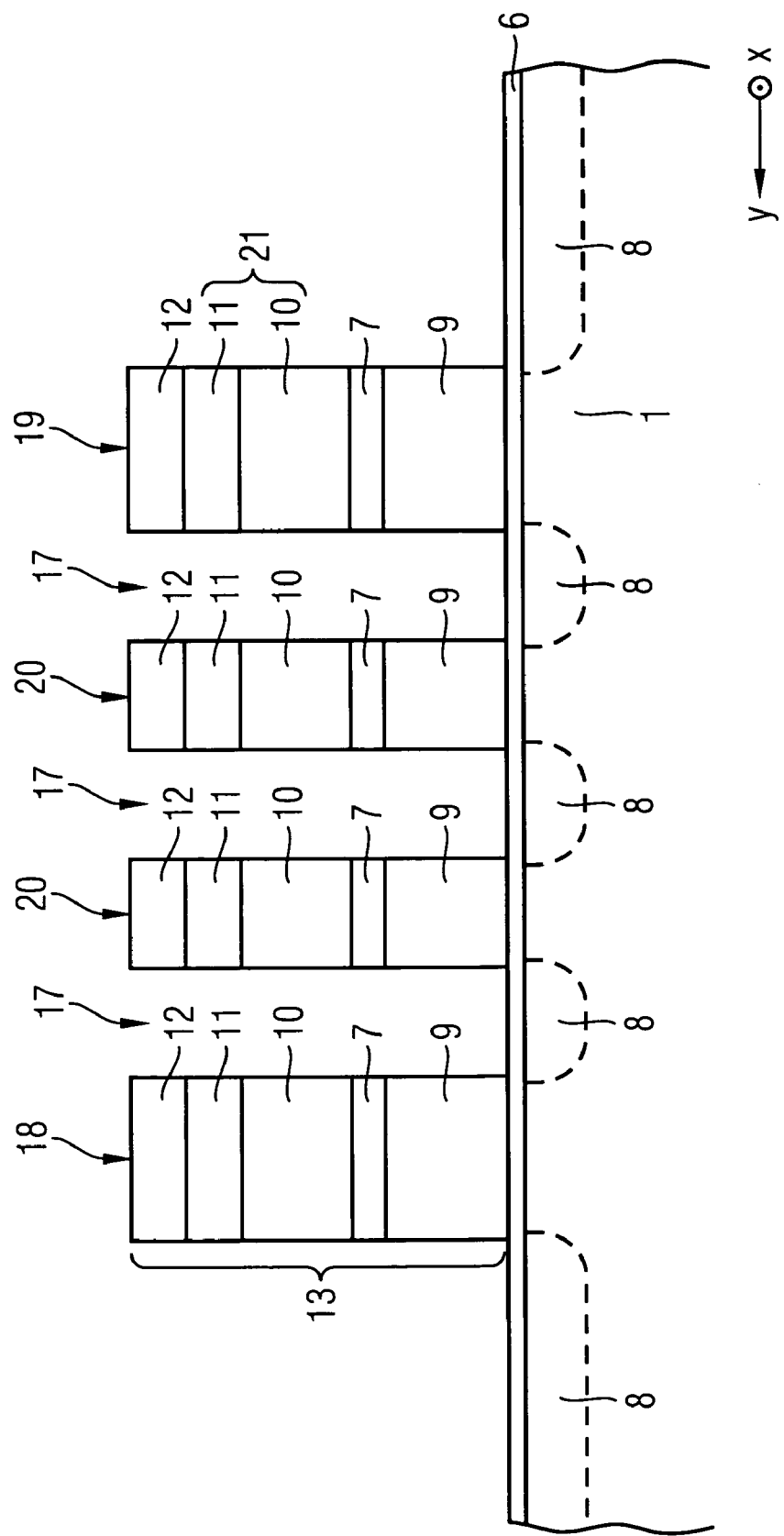

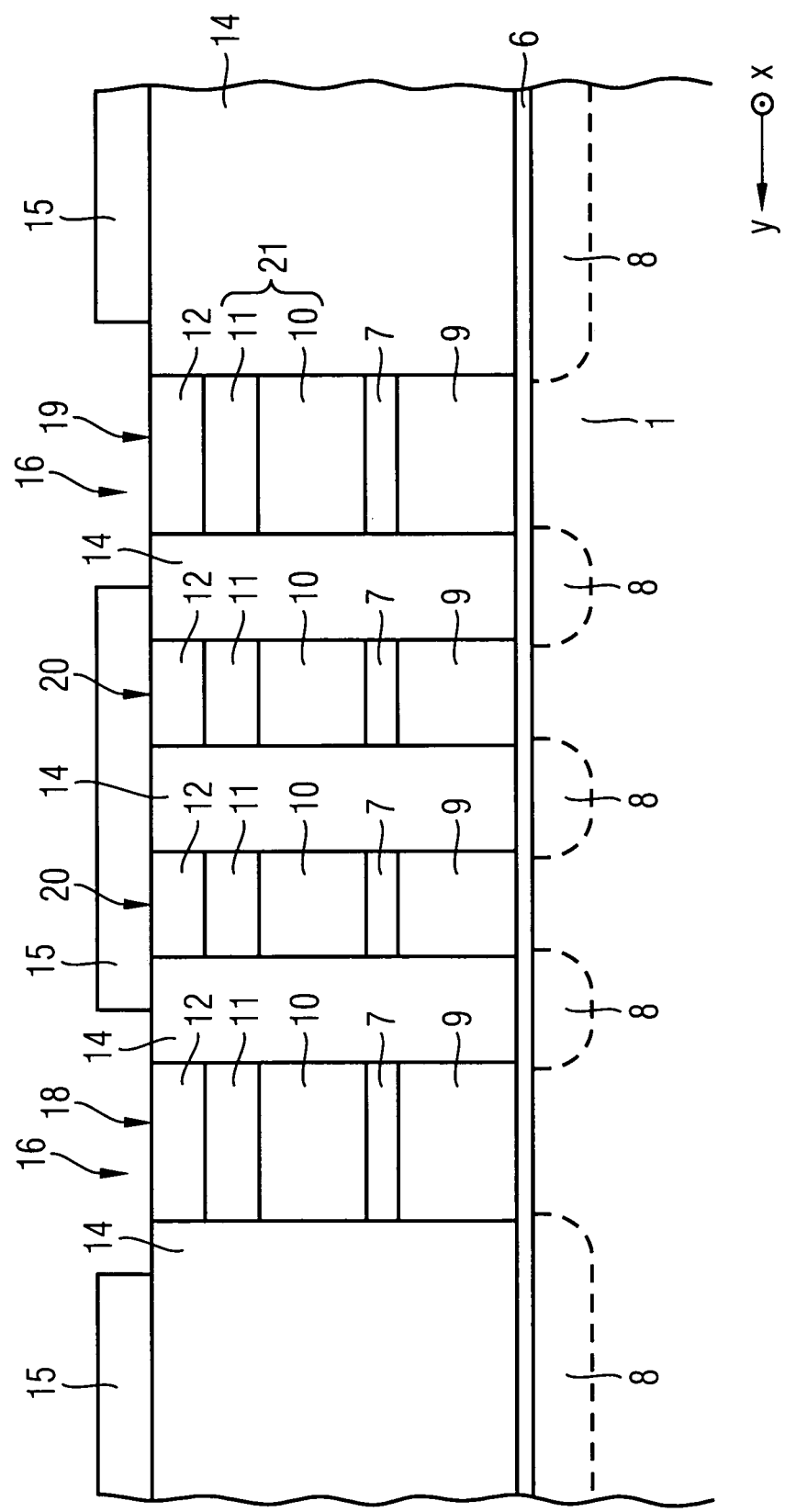

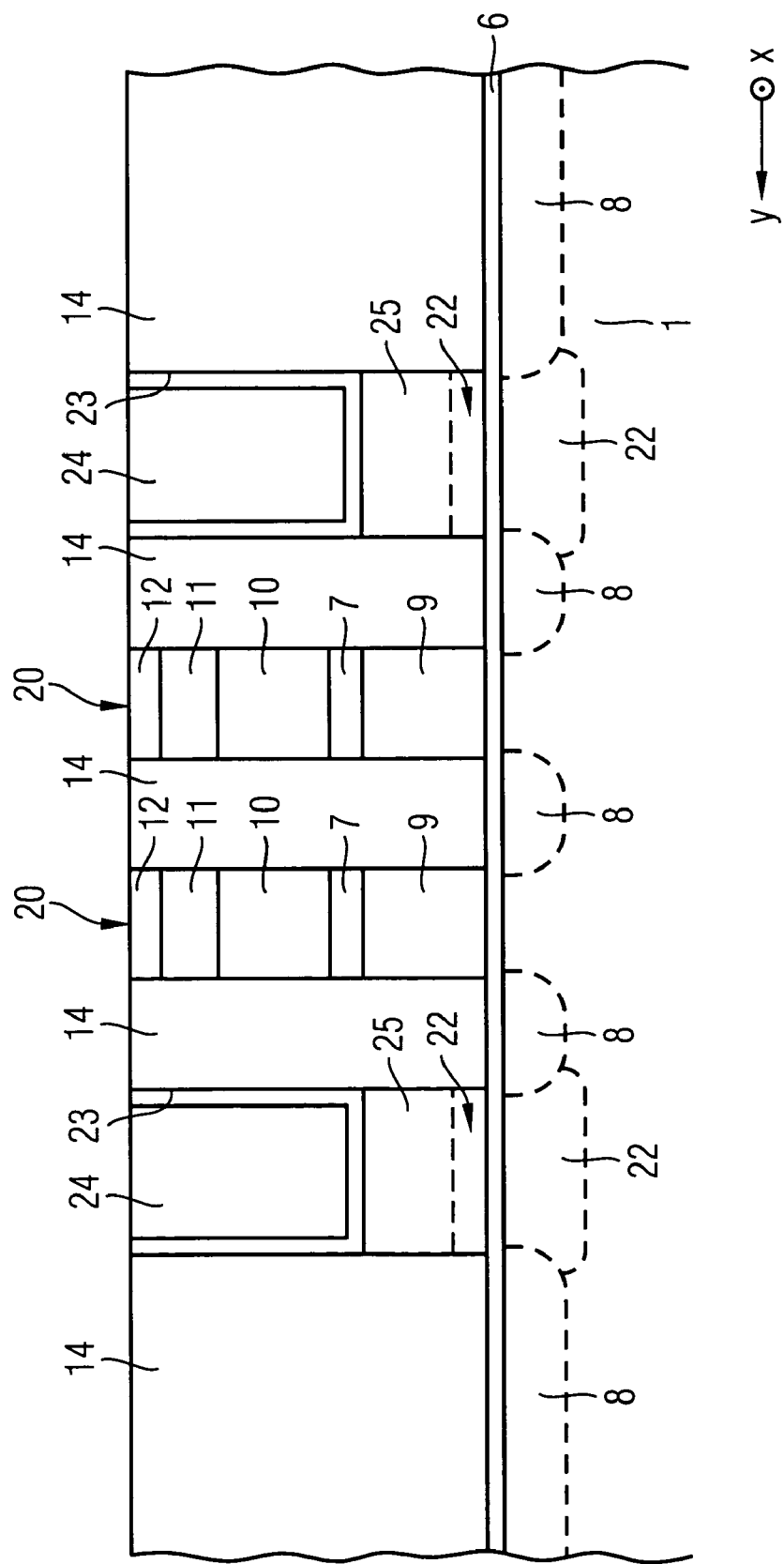

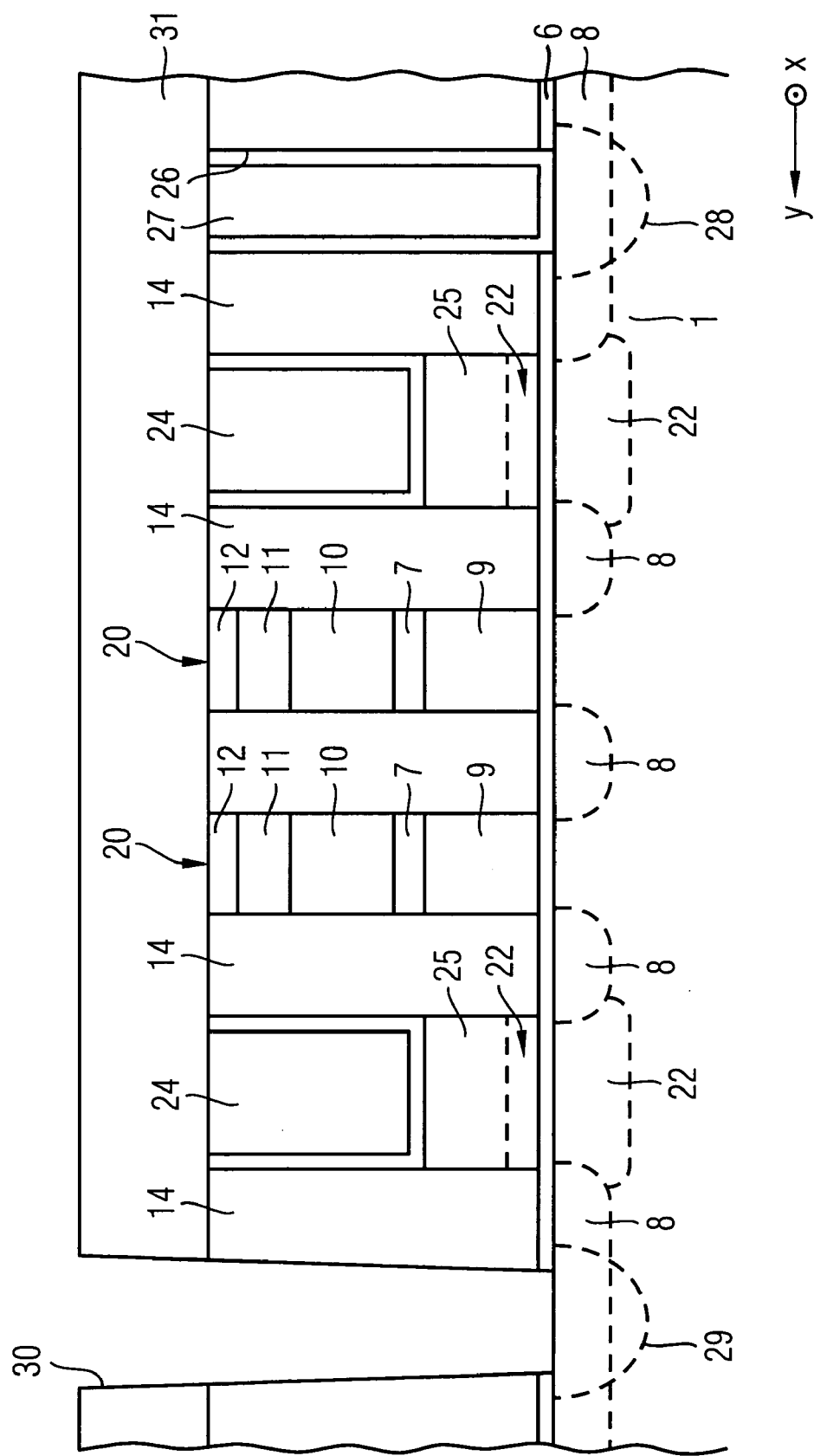

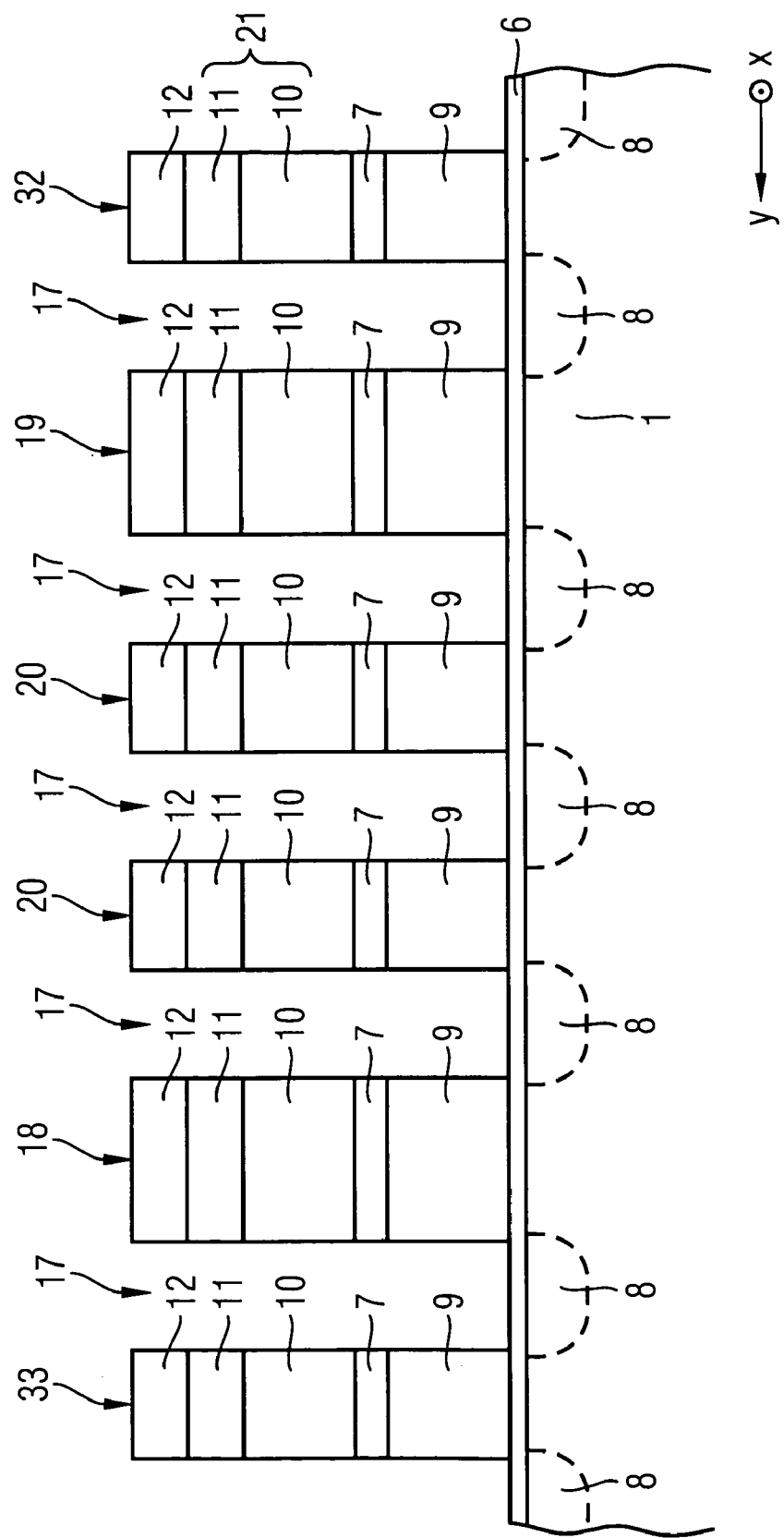

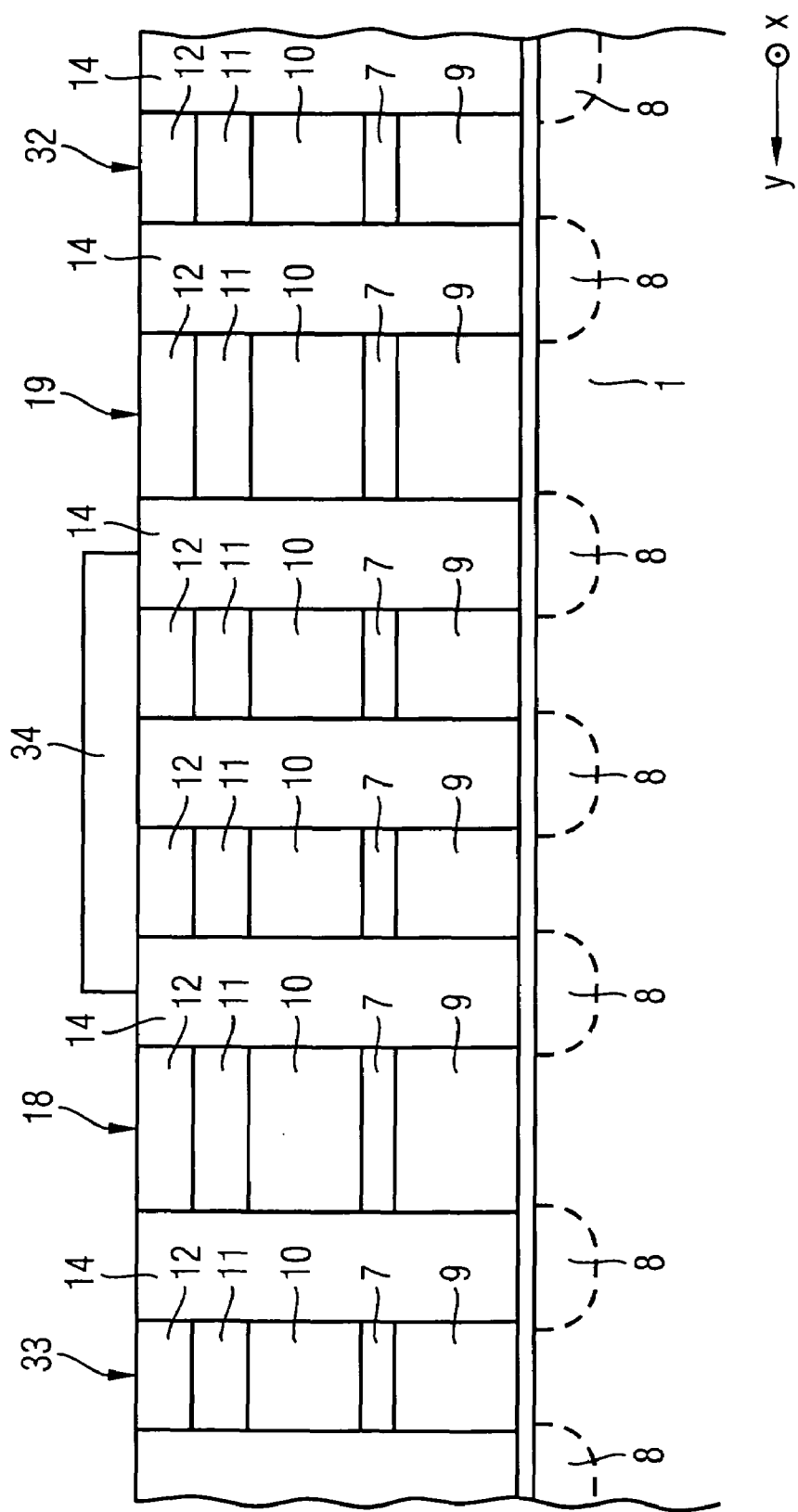

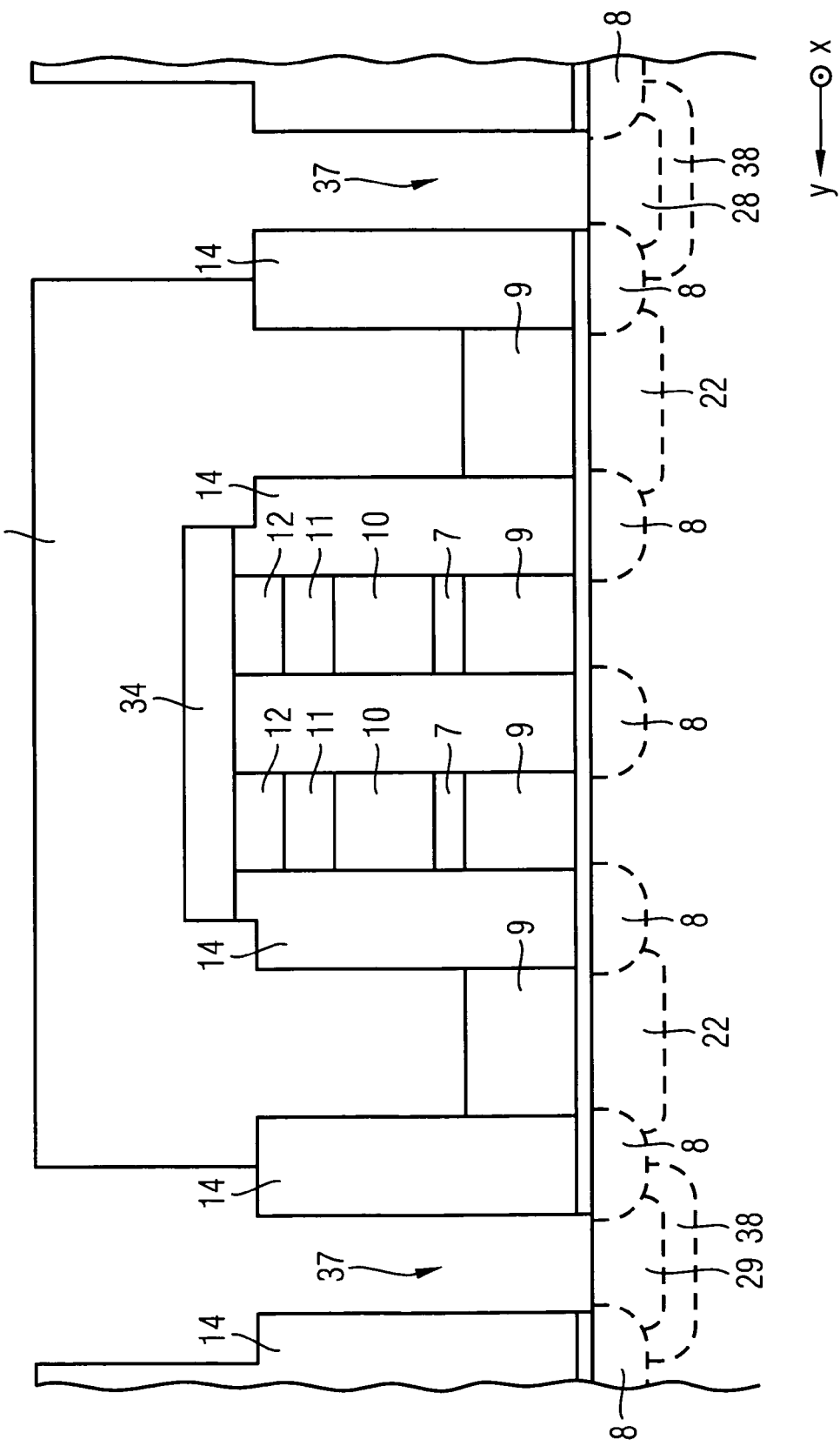

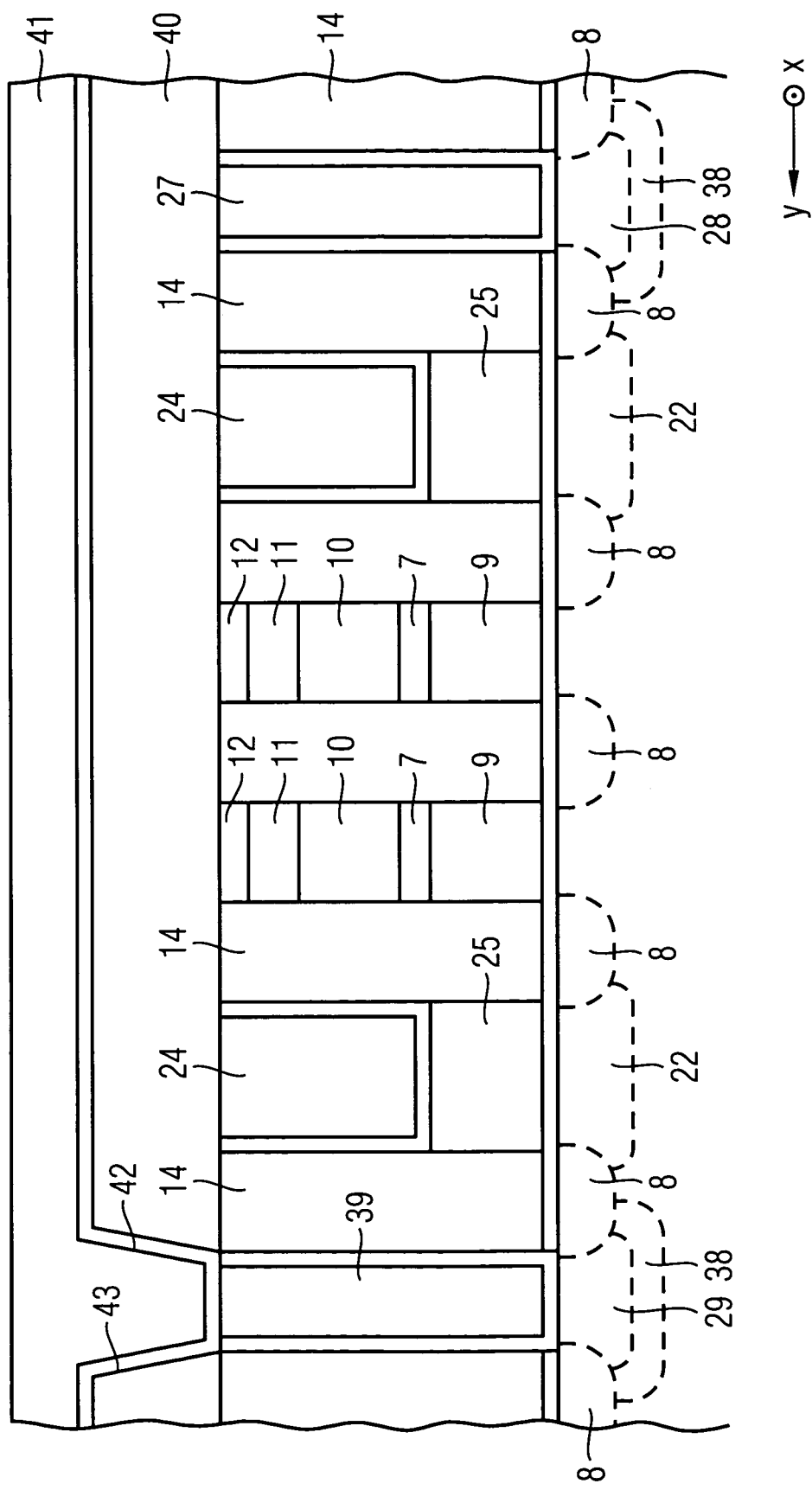

METHOD OF MANUFACTURING A MEMORY DEVICE

FIELD OF THE INVENTION

This invention is in the field of non-volatile semiconductor memory devices, and more particularly, relates to a flash memory device having a NAND array of flash memory cells with floating gate electrode, and manufacturing methods thereof.

BACKGROUND

Non-volatile flash memory cells are known to be formed by a transistor structure comprising a channel that is located between source and drain and controlled by a control gate electrode, and a floating gate electrode that is provided as storage means. NAND arrays of flash memories having memory cells with floating gate are, for instance, described in Y.-S. Yim et al., "70 nm NAND Flash Technology with 0.025 µm² Cell Size for 4 Gb Flash Memory" in IEDM 2003, Session 34.1.

More particularly, each of the flash memory cells comprises a transistor body of semiconductor material, which is limited on two opposing sides by electrically insulating material of shallow trench isolations (STIs). An upper surface of the transistor body is planar and covered with a dielectric material, which is provided as tunneling oxide. Above the tunneling oxide, the floating gate electrode made of electrically conductive material is arranged that is surrounded by dielectric material and thus completely electrically insulated. A control gate electrode is arranged above the floating gate electrode and capacitively coupled to the floating gate electrode by a coupling dielectric layer inbetween the floating gate and control gate electrodes. The inter-gates coupling dielectric layer typically is made of an oxide-nitride-oxide (ONO) structure and includes first, second and third layers of silicon oxide, silicon nitride and silicon oxide, respectively. Programming or erasing of flash memory cells may, for instance, be based on Fowler-Nordheim tunneling through the tunneling oxide layer between the floating gate electrode and the semiconductor body.

In a typical NAND array of flash memory cells, control gate lines (or word lines) forming or contacting the control gate electrodes of the flash memory cells cross over STIs. Furthermore, bit lines are arranged above the control gate lines isolated therefrom and in parallel alignment to STIs (crossing the control gate lines) which are electically contacting the semiconductor substrate active regions.

Now referring to FIG. 1, a schematic top-down view of a typical NAND-type flash memory cell array is shown, where memory cells are arranged in rows and columns. Each NAND string that comprises a series connection of plural memory cells, typically 32, and two selection transistors is interconnected between a bit line contact BC and a common ground (source) line SL running in the x-direction. Crossing bit lines that run in the y-direction and define columns, a plurality of word lines WL and two selection transistor lines, namely a source line sided selection transistor line SSL and a bit line sided selection transistor line BLS, that run in x-direction and defining rows are arranged, where memory cell control gate electrodes are connected to the word lines and selection transistor control gate electrodes are connected to the selection transistor lines. Between adjacent bit lines, bit line pitch F may be identified.

Reference is made to FIG. 2, depicting a partial schematic cross-sectional view of the conventional NAND memory cell array of FIG. 1, which section is taken along line I-I (x-direction) of FIG. 1. In a typical manufacturing method thereof, on a semiconductor substrate 1 (or body) provided with active structures separated by shallow trench isolations 2 a tunneling oxide layer 6 is deposited on an upper surface of the substrate, followed by a deposition of a floating gate layer on the tunneling oxide layer 6. Then, the floating gate layer is structured using conventional lithography steps and etched to prepare floating gate lines in parallel alignment to bit lines to be prepared. As is typical, floating gate lines are merely structured in a region of memory cells to be prepared thus leaving the floating gate layer unstructured in regions of selection transistor lines and source lines to be prepared based on the fact that in conventional processing floating gate electrode level is used for manufacturing selection transistor control gate electrodes, which, however, requires to not interrupt selection transistor lines intended to run in a direction crossing the floating gate lines. After deposition of a coupling dielectric layer 7 on the floating gate lines and unstructured remnants of the floating gate layer, deposition of a word line layer follows that is structured to prepare word lines running in a direction crossing the floating gate lines. Structuring the word lines, etching proceeds to thereby create isolated floating gate electrodes. Also, yet unstructured regions of the floating gate layer are structured to create the selection transistor lines and allow later on to create source lines. The source lines are typically made in a separate step by filling polysilicon into grooves of planarized interlevel dielectric. Hence, referring to FIG. 2, in conventional processing a source line sided selection transistor line SSL is created above the tunneling oxide layer 6, and, a "word line" (without any function) out of the word line layer is created on the coupling dielectric layer 7. Then, metallic line 5 is formed which is in electrical contact with the SSL by providing electric contact 3. In order to suppress undesired effects based on capacitive coupling, it is usual to electrically connect metallic line 5 to conductive line "WL".

Accordingly, selection transistor lines manufactured in floating gate line level typically consist of polysilicon thus having an undesired high electrical resistivity. Apparently, using conventional processing steps, it is not possible to reduce the high electric resistivity thereof as typically is done in the case of word lines where metallic layers such as WSi are deposited on polysilicon.

SUMMARY

Embodiments of the present invention provide a method of making a memory device and a memory device. In one embodiment, the present invention provides a method of manufacturing a memory device. The method includes providing a substrate having a tunneling layer deposited on a main surface and having a first conductive lines arranged on the tunneling layer running in a first direction. A layer of dielectric material is deposited on the first conductive lines. A control gate layer is deposited. The first conductive lines are patterned to produce gate stacks. Dielectric material is deposited in between the gate stacks. The gate stacks are partially removed to uncover floating gate electrodes in region of selection transistor lines to be prepared creating selection transistor line recesses running in the second direction. The selection transistor line recesses are filled with a conductive material to create the selection transistor lines.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 is a partial schematic cross-sectional view of the NAND memory cell array of FIG. 1 taken along line I-I of FIG. 1.

FIGS. 3A-3D are schematic cross-sectional views of subsequent intermediate products in manufacturing a NAND memory cell array according to a first embodiment of the invention, which sections are taken along line II-II of FIG. 1.

FIGS. 4A-4F are schematic cross-sectional views of subsequent intermediate products in manufacturing a NAND memory cell array according to a second embodiment of the invention, which sections are taken along line II-II of FIG. 1.

DETAILED DESCRIPTION

Figure 1:
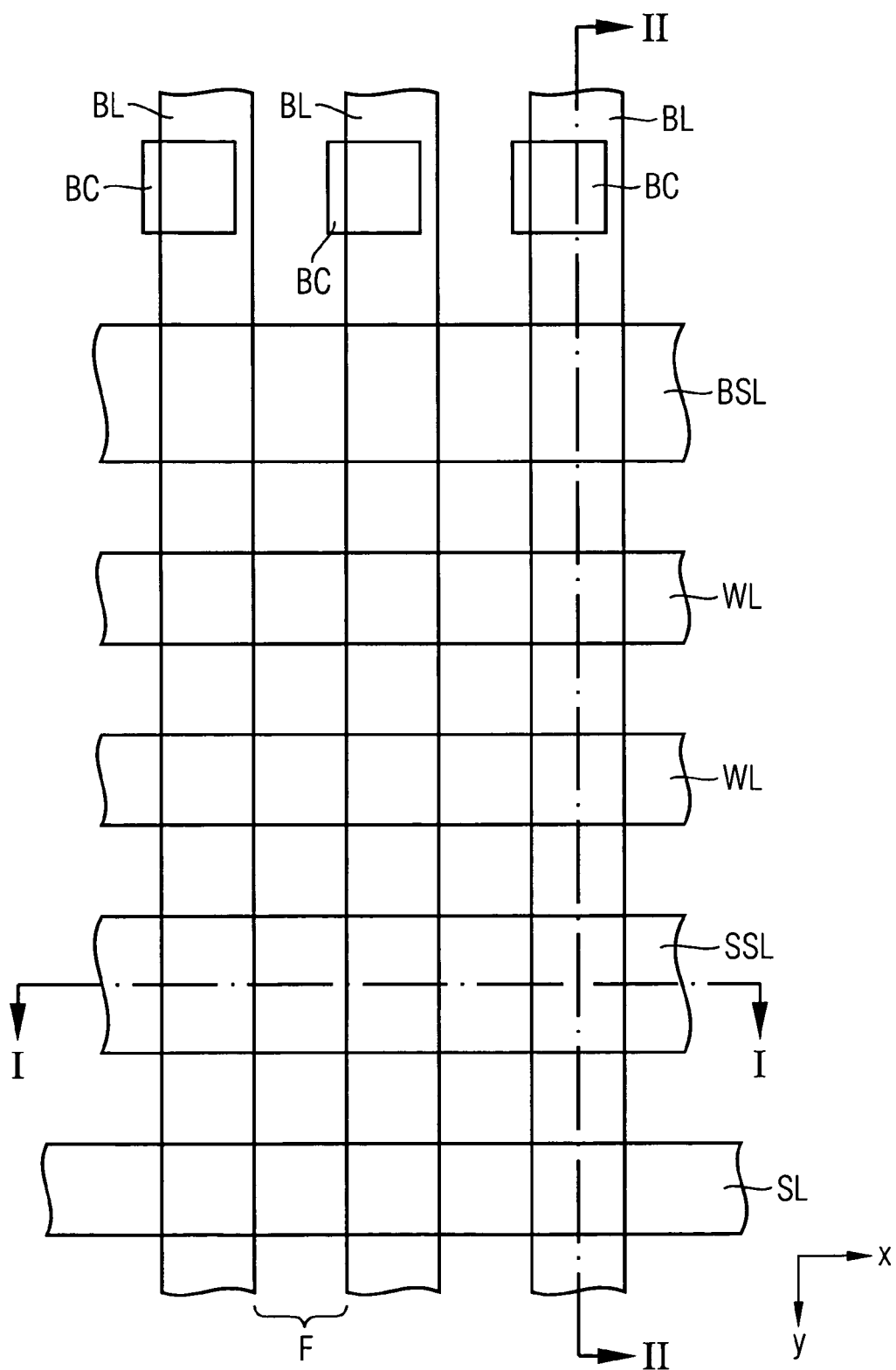
FIG. 1 is a schematic top-down view of a NAND-type flash memory cell array.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In view of the above, the present invention to provide a method of fabricating a NAND flash memory cell array, where electric resistivity of selection transistor lines and source lines is reduced compared to conventional selection transistor lines and source lines.

According to one embodiment of the invention, a method of manufacturing a flash memory device comprising a NAND-array of memory cells with floating gate electrodes is given, in which a substrate (or body) of semiconductor material is provided having a layer of dielectric material provided as tunneling oxide layer deposited on an upper surface thereof and having first conductive lines of electrically conductive material arranged on the tunneling oxide layer running in a first direction, which first conductive lines preferably are made in a self-aligned manner. In such method, on the first conductive lines a layer of dielectric material that is provided as coupling dielectric layer is deposited. Further, a layer of electrically conductive material provided as control gate layer is deposited and patterned in a second direction crossing the first direction to produce second conductive lines merely in a region of memory transistors and selection transistors to be prepared. Patterning the control gate layer is used to thereby pattern the first conductive lines to produce gate stacks. Then, in between the gate stacks, dielectric material is formed. After that, the gate stacks are partially removed to uncover the floating gate electrodes in regions of selection transistor lines to be prepared creating selection transistor line recesses running in the second direction. The selection transistor line recesses then are filled with conductive, in particular metallic material to create the selection transistor lines.

In above method according to the first embodiment of the invention, in order to prepare source lines, the substrate may be selectively uncovered in a region of source lines to be prepared to create source line recesses running in the second direction, followed by a fill of the source line recesses with conductive, in particular metallic material to create the source lines.

Also in above method according to the first embodiment of the invention, in order to prepare bit line contacts, the substrate may be selectively uncovered in a region of bit line contacts to be prepared to create bit line recesses, followed by a fill of the bit line recesses with conductive, in particular metallic material to create the bit line contacts.

In above method according to the first embodiment of the invention, the selection transistor line recesses and the source line recesses may be filled with conductive material in a same step or in different steps.

According to a second embodiment of the invention, a method of manufacturing a flash memory device comprising a NAND-array of memory cells with floating gate electrodes is given, in which a substrate (or body) of semiconductor material is provided having a layer of dielectric material provided as tunneling oxide layer deposited on a upper surface thereof and having first conductive lines of electrically conductive material arranged on the tunneling oxide layer running in a first direction, which first conductive lines preferably are made in a self-aligned manner. In such method, on the first conductive lines a layer of dielectric material that is provided as coupling dielectric layer is deposited. Further, a layer of electrically conductive material provided as control gate layer is deposited and patterned in a second direction crossing the first direction to produce second conductive lines merely in regions of memory transistors, selection transistors and source lines to be prepared. Patterning the control gate layer is used to thereby pattern the first conductive lines to produce gate stacks. Then, in between the gate stacks, dielectric material is formed. After that, the gate stacks are partially removed to uncover the floating gate electrodes in regions of selection transistor lines and source lines to be prepared creating selection transistor line recesses and first source line recesses, respectively, running in the second direction. After that, the gate stacks are totally removed to uncover the substrate merely in regions of source lines to be prepared creating second source line recesses running in the second direction. The selection transistor line recesses and second source line recesses, respectively, then are filled with conductive, in particular metallic material to create the selection transistor lines and source lines, respectively.

In above method according to the second embodiment of the invention, in order to prepare bit line contacts, the substrate may be selectively uncovered in a region of bit line contacts to be prepared to create bit line recesses, followed by a fill of the bit line recesses with conductive, in particular metallic material to create the bit line contacts.

According to a third embodiment of the invention, a method of manufacturing a flash memory device comprising a NAND-array of memory cells with floating gate electrodes is given, in which a substrate (or body) of semiconductor material is provided having a layer of dielectric material provided as tunneling oxide layer deposited on an upper surface thereof and having first conductive lines of electrically conductive material arranged on the tunneling oxide layer running in a first direction, which first conductive lines preferrably are made in a self-aligned manner. In such method, on the first conductive lines a layer of dielectric material that is provided as coupling dielectric layer is deposited. Further, a layer of electrically conductive material provided as control gate layer is deposited and patterned in a second direction crossing the first direction to produce second conductive lines in regions of memory transistors, selection transistors, source lines and bit line contacts to be prepared. Patterning the control gate layer is used to thereby pattern the first conductive lines to produce gate stacks. Then, in between the gate stacks, dielectric material is formed. After that, the gate stacks are partially removed to uncover the floating gate electrodes in regions of selection transistor lines, source lines and bit line contacts to be prepared creating selection transistor line recesses, first source line recesses and first bit line contact recesses, respectively, running in the second direction. After that, the gate stacks are totally removed to uncover the substrate merely in regions of source lines and bit line contacts to be prepared creating second source line recesses and second bit line contact recesses, respectively, running in the second direction. The selection transistor line recesses, the second source line recesses and the second bit line contact recesses, respectively, then are filled with conductive, in particular metallic material to create the selection transistor lines, source lines, and bit line contacts, respectively.

In above methods it may be preferred to implant one or more dopants into the substrate in between the gate stacks before depositing dielectric material in between the gate stacks in order to appropriately create source/drain junctions, connect adjacent transistors, or adapt threshold voltages of memory transistors.

In above methods it may also be preferred to implant one or more dopants into the floating gates before the selection transistor line recesses are filled with conductive, in particular metallic material, to create the selection transistor lines in order to create low ohmic contacts to the floating gate material and appropriately adapt threshold voltages of selection transistors.

In above methods it may also be preferred to implant one or more dopants into the substrate before the source line recesses are filled with conductive, in particular metallic material to create the source lines in order to appropriately adapt electric resistivity of the source line contacts.

The present invention further contemplates a flash memory device comprising a NAND-array of floating gate memory cells, which memory cells are arranged in NAND-strings, where each NAND-string comprises a serial connection of floating gate memory transistors and at least one selection transistor for the selection thereof. Each NAND-string is electrically interconnected between a bit line running in a first direction and a source line running in a second direction crossing the first direction. Each memory transistor has a control gate electrode that is in electric contact with a word line running in the second direction. Each selection transistor has a control gate electrode that is in electric contact with a selection transistor line being in parallel alignment to the word lines. In a flash memory device according to the invention, each of the selection transistor lines is made of metallic material. In a one embodiment of the flash memory device according to the invention, also the source lines are made of metallic material. In another embodiment of the flash memory device according to the invention, also bit line contacts are made of metallic material.

Now referring to FIGS. 3A through 3D which depict schematic cross-sectional views of subsequent intermediate products in manufacturing a NAND memory cell array according to the invention, a process of manufacturing a NAND memory cell array (first embodiment) is described. The sectional views of the intermediate products are taken along line II-II of FIG. 1 that is to say in parallel alignment to the bit lines. More specifically, FIGS. 3A to 3D illustrate a process of manufacturing a single NAND string.

As can be taken from FIG. 3A, in a first intermediate product of manufacturing a NAND string in a NAND memory cell array according to the invention, on a substrate 1 of semiconductor material that is provided with source/drain areas 8 a layer of dielectric material provided as tunneling dielectric layer 6, typically an oxide such as silicon dioxide, is deposited on a main surface of the substrate 1. On the tunneling dielectric layer 6, a plurality of gate stacks 13 is arranged, where each one of the gate stacks 13 comprises a plurality of floating gate electrodes 9, typically made of polysilicon, arranged in x-direction, a coupling dielectric 7 arranged on and in between the floating gate electrodes 9, a control gate electrode line 21 on the coupling dielectric running in x-direction that typically consists of two materials, namely a first subline 10 typically made of polysilicon and a second subline 11 typically made of metal, such as W or WN, and a hard mask line 12 on the control gate electrode line running in x-direction. In FIG. 3A, the gate stacks 13 are separated by inter-stack recesses 17.

In the schematic sectional views of FIGS. 3A-3D, gate stacks having reference numeral 20 are intended for manufacturing of memory transistors of a single NAND-string. While in FIGS. 3A-3D two gate stacks 20 are illustrated for the purpose of simplicity only, those skilled in the art will appreciate that more than two memory transistors, such as 32, may be present in a single NAND string. Gate stack having reference numeral 18 may be seen as replacement structure for manufacturing a source line sided selection transistor, and, gate stack having reference numeral 19 may be seen as replacement structure for manufacturing a bit line sided selection transistor, where both gate stacks 18, 19 are arranged to sandwich the gate stacks 20 for manufacturing the memory transistors.

In order to manufacture the intermediate product of FIG. 3A, floating gate lines that run in y-direction in parallel alignment with bit lines to be produced or in orthogonal alignment with word lines to be produced, respectively, are formed on the tunneling dielectric layer 6.

Forming the floating gate lines preferrably is effected in a self-aligned manner. For instance, manufacturing the floating gate lines in a self-aligned manner, on a substrate of semiconductor material being provided with active areas a pad oxide layer is deposited, followed by a deposition of a pad nitride layer on the pad oxide layer. After performing lithography steps, trenches are etched in the substrate in between the active structures in parallel alignment to bit lines to be produced, followed by filling the trenches with dielectric material such as silicon dioxide, and chemical-mechanical polishing of the dielectric material. Then, pad nitride and pad oxide layers are etched in between the trenches to create recesses (trenches) for the floating gate lines. After that, a tunneling oxide layer is grown, followed by a deposition of a layer of electrically conductive material, such as polysilicon, and chemical-mechanical polishing of the electrically-conductive material outside the filled trenches. The floating gate lines then are produced by uncovering their vertical sides by removing the isolation trenches fill for example by means of wet etching.

After manufacturing the floating gate lines as above-described, a layer of dielectric material provided as inter-gates coupling dielectric layer is deposited on the floating gate lines, followed by a deposition of a control gate layered stack, comprised of a first sublayer made of polysilicon and a second sublayer made of metallic material. Then, a hard mask layer is deposited on the control gate layered stack. After performing typical lithography steps, recesses 17 are etched to create stacks 13. Etching recesses 17 results in manufacturing floating gate electrodes 9 from the earlier produced floating gate lines running in y-direction.

In FIG. 3A, optionally, using opened recesses 17 one or more dopants may be implanted in the substrate 1, including the formation of source/drain junctions.

Now, referring to FIG. 3B, an inter-stack dielectric 14 is formed in between the stacks 13, which is effected by depositing/growing a layer of dielectric material on the gate stacks 13, followed by a planarization using chemical-mechanical polishing that stops on the first hard mask 12. Typically, as is conventional, the inter-stack dielectric 14 may consist of an oxide, a spin-on glas or a low-k dielectric. Then, another hard mask layer which may consist of carbon is deposited and patterned using conventional lithography steps to result in second hard mask 15. Patterning of the hard mask layer to manufacture the second hard mask 15 is effected in such a way that openings 16 only above gate stacks 18, 19 intended to fabricate the selection transistor control gate lines are created.

Then, FIG. 3C, using the second hard mask 15, in gate stacks 18, 19, the first hard mask 12, metal layer 11 inclusive barrier layer (not shown in the drawings) and control gate layer 10 are removed in a self-aligned manner for instance using reactive ion etching (RIE), followed by removal of the thin coupling dielectric 7 for instance using RIE and/or wet etch also in a self-aligned manner, to create recesses 23 (trenches running in x-direction) and to uncover upper surfaces of the floating gate electrodes 9.

In FIG. 3C, at this stage, it optionally may be preferred to implant one or more dopants into the floating gate electrodes 9 and/or substrate 1 to create implants 22, in order to appropriately adjust threshold voltage of the selection transistor to be prepared. More particularly, conductivity of selection transistor gate electrodes may be adjusted in a way to trim threshold voltage as appropriate. For instance, selection transistors having positive threshold voltages that are normally off may be fabricated. In addition, a shallow high doping concentration may be implanted to ensure a good ohmic contact between floating gate electrodes and subsequently deposited metal.

Then, a metallic layer for instance made of Ti/TiN, WN/W or Ta/TaN Cu is deposited at least on recesses 23 using a conventional deposition technique such as chemical-vapour deposition and/or sputtering or plating, followed by a planarization that stops on the first hard mask 12, to create selection transistor control gate lines 24 that are in direct electric contact with previous floating gate electrodes 9 and running in x-direction. Apparently, previous floating gate electrodes 9 now have been converted to (non-floating) control gate electrodes 25 of the selection transistors being directly electrically contacted by metal lines 24 thus having a comparably low electric resistivity.

Now referring to FIG. 3D, using conventional lithography and etch steps, a recess 26 in dielectric material 14 to uncover an upper surface of substrate 1 is created, followed by a deposition of metallic material in direct electric contact with substrate 1 and planarization thereof to fill recess 26 and to create source line 27. Before filling recess 26, one or more dopants may be implanted in the substrate 1 to create an implanted region 28 to appropriately adjust electric contact resistance of source line 27.

While etching of recesses 23 for selection transistor control gate lines 24 typically is different from etching of recess 26 for source line 27, filling of these recesses 23, 26 using metallic material can be effected in a same (single) step.

After depositing another dielectric layer 31, bit line contact hole 30 is formed to thereby uncover an upper surface of the substrate 1, that may be appropriately implanted to create implanted region 29 to adjust electric conductivity of the bit line contact to be fabricated. After that, the manufacturing process continues with conventional steps of fabricating a bit line contact in the bit line hole 30 and formation of bit lines.

Now referring to FIGS. 4A through 4F which depict schematic cross-sectional views of subsequent intermediate products in manufacturing a NAND memory cell array, another process of manufacturing a NAND memory cell array (second embodiment) is described. The sectional views of the intermediate products are taken along line II-II of FIG. 1 as in the first embodiment of the invention.

In order to avoid unnecessary repetitions, in the second embodiment of the invention, only differences as to the first embodiment of the invention as shown in FIGS. 3A through 3D are described, while otherwise reference is made thereto.

In FIG. 4A, a first intermediate product of manufacturing a NAND string in a NAND memory cell array according to the second embodiment of the invention is shown. In FIG. 4A, gate stacks 20 are intended for manufacturing of memory transistors of a single NAND-string (more than two memory transistors will typically be manufactured). Gate stack having reference numeral 18 is a replacement structure for manufacturing a source line sided selection transistor, gate stack having reference numeral 19 is for manufacturing a bit line sided selection transistor, where both gate stacks 18, 19 are arranged to sandwich the gate stacks 20 for manufacturing the memory transistors, gate stack having reference numeral 32 is for manufacturing a source line, and, gate stack having reference numeral 33 is for manufacturing a bit line contact. The intermediate product of FIG. 4A may be manufactured as described in connection with FIG. 3A, where floating gate lines preferrably are fabricated in a self-aligned manner. Optionally, using recesses 17 one or more dopants may be implanted in the substrate 1.

Now referring to FIG. 4B, after forming an inter-stack dielectric 14 in between the gate stacks a hard mask layer is deposited and patterned using conventional lithography steps to result in second hard mask 34 having openings to uncover gate stacks 18, 19, 32, 33 that are replacement structures intended to fabricate the selection transistor control gate lines, source line and bit line contact.

Figure 4C:
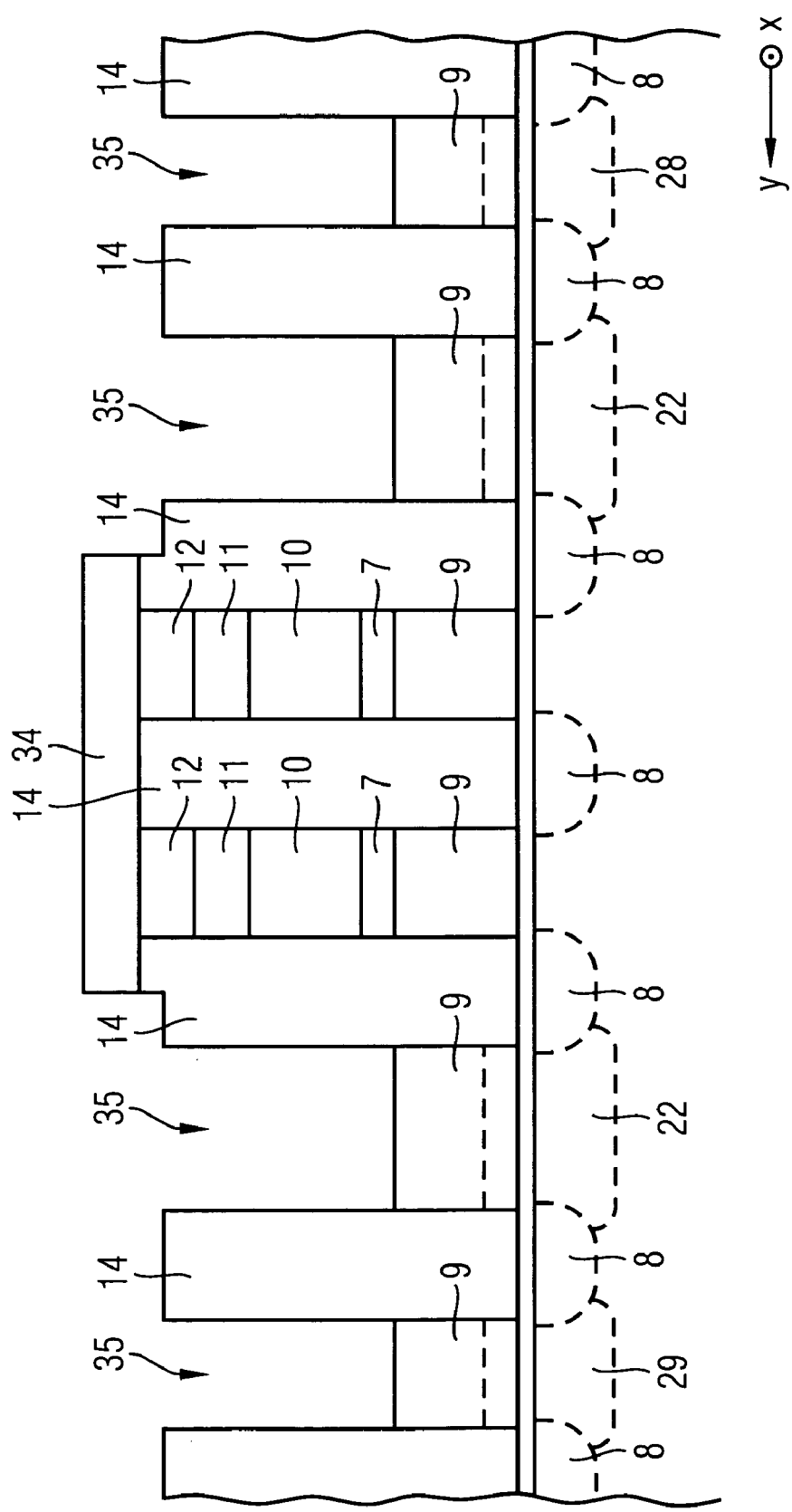

Then, FIG. 4C, using the second hard mask 15, in gate stacks 18, 19, 32, 33 the first hard mask 12, metal layer 11 inclusive barrier layer (not shown in the drawings) and control gate layer 10 are removed in a self-aligned manner for instance using reactive ion etching (RIE), followed by removal of the thin coupling dielectric 7 for instance using RIE and/or wet etch also in a self-aligned manner, to create recesses 23 (trenches running in x-direction) to uncover upper surfaces of the floating gate electrodes 9. Optionally, it can be preferred to implant one or more dopants into the floating gate electrodes 9 and/or substrate 1 to create implants 22, 28, 29 in order to appropriately adjust the threshold voltage and the metal to floating gate layer contact resistance of the selection transistor to be prepared, respectively.

Then, FIG. 4D, another hard mask layer is deposited on recesses 35 and is patterned using conventional lithography steps to create a third hard mask 36 having openings that uncover recesses 35 intended to create the source line and bit line contact. After that, recesses 37 are etched for instance using RIE to remove floating gate electrode 9 material, such as polysilicon, and thin tunneling dielectric layer 6 material, such as silicon dioxide, to uncover an upper surface of the substrate 1. At this stage, further contact implants 38 with much higher dosis than the threshold voltage adjust implants to selectively adapt electric conductivities of the source line and bit line contact, respectively, may be implanted if desired.

Figure 4E:
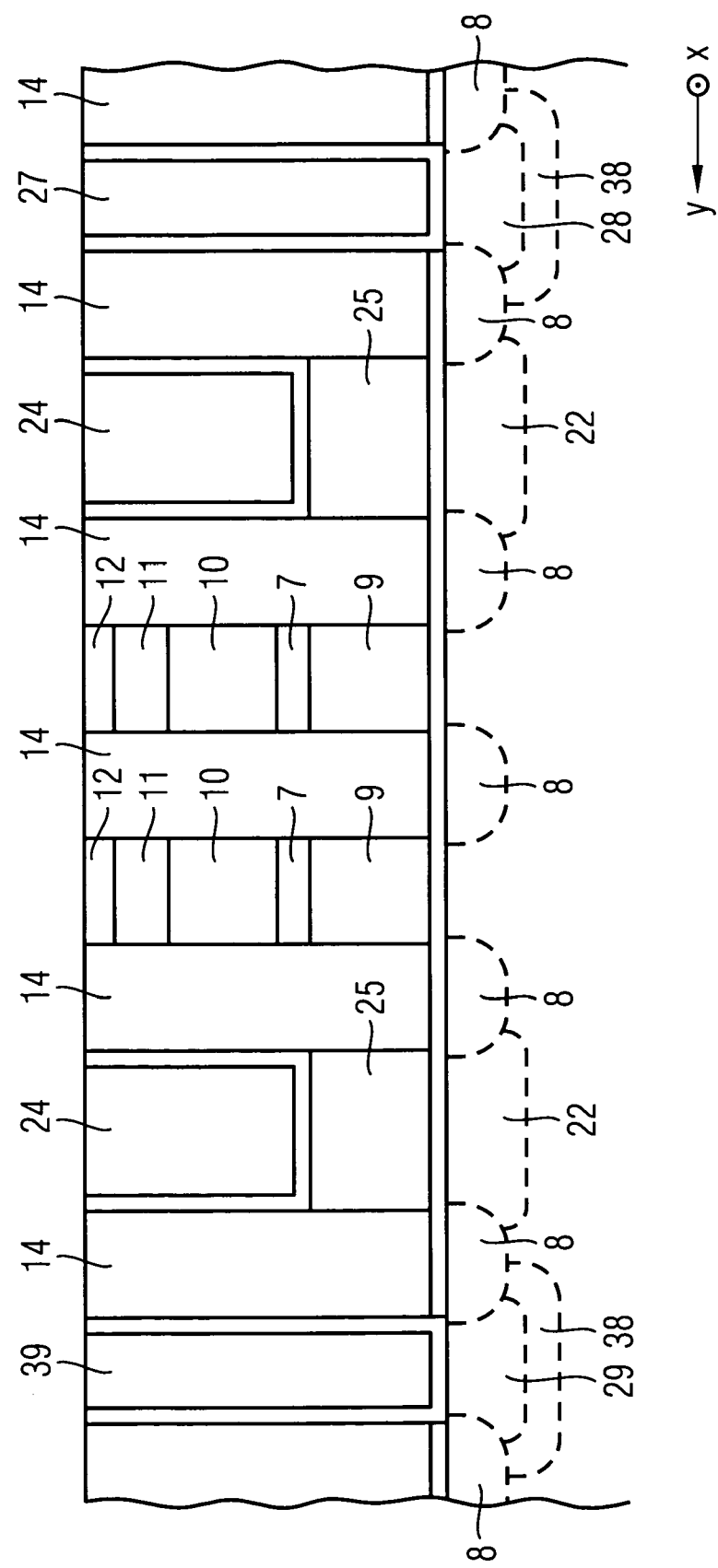

Then, FIG. 4E, after removing third hard mask 36, a metallic layer for instance made of Ti/TiN, WN/W or Ta/TaN Cu is deposited above the recesses using a conventional deposition technique such as chemical-vapour deposition or sputtering, followed by a planarization that stops on the first hard mask 12, to create selection transistor lines 24 that are in direct electric contact with previous floating gate electrodes 9, to create source line 27 that is in direct electric contact with an upper surface of the substrate 1 such as implant 38 (while implant 28 is compensated), and to create bit line contact 39 that is in direct electric contact with an upper surface of the substrate 1 such as implant 38 (while implant 29 is compensated). As in the first embodiment of the invention, previous floating gate electrodes 9 thus have been converted to (non-floating) control gate electrodes 25 of the selection transistors being directly electrically contacted by metal lines 24 thus having a comparably low electric resistivity. Likewise source line 27 and bit line contact 39, respectively, are made of metallic material thus having a comparably low electric resistivity.

Now referring to FIG. 4E, array fabrication proceeds in depositing a dielectric layer 40 made of isolating material that is patterned using conventional lithography steps to create recess 43 above bit line contact 39. Then, bit line 41 running in y-direction that is to say orthogonally aligned to selection transistor control gate lines 24 is formed on dielectric layer 40 using conventional lithography and etch steps, where protrusion 42 is formed in the recess 43 to electrically contact the bit line contact 39. For addressing bit line contact 39, a dual damascene process scheme may be applied.

In the present invention, the problem of narrow spaced selection transistor control gate lines, source lines and bit line contacts in conjunction with self-aligned floating gates of NAND arrays is solved. In the first approach the selection transistor control gate lines are formed using wordline layers above self-aligned floating gate layers. After deposition and planarization of the isolation the control gate layers are removed and replaced by conductive (metal) select line material. Thus, the select lines are compatible with self-aligned floating gates, have high conductivity and are self-aligned to the memory cell array, especially to the word lines. In the second embodiment, not only the select gates but also the bit line contact and the source line are treated accordingly. While the floating gate layer is addressed in the case of the select lines using an ohmic contact, the substrate must be contacted directly in the case of source line and bit line contact. Thus, all features advantageously are self-aligned in bitline direction. Accordingly, the benefits of the present invention are a low address line resistance, a low resistive bit line and source line access, an improved manufacturability by self-alignment and compatibility with the self-aligned floating gate approach, and, scalability to below 50 nm. In the present invention, a basic principle is to utilize word line level in a floating gate NAND array and to partially remove it in order to obtain self-aligned, highly conductive properties of the remaining address lines.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a memory device comprising:
   providing a substrate having a tunneling layer deposited on a main surface and having first conductive lines arranged on the tunneling layer running in a first direction;
   depositing a layer of dielectric material on the first conductive lines;
   depositing of a control gate layer;
   patterning the first conductive lines to produce gate stacks;
   depositing dielectric material in between the gate stacks;
   partially removing the gate stacks to uncover floating gate electrodes in regions of selection transistor lines to be prepared creating selection transistor line recesses running in a second direction; and
   filling the selection transistor line recesses with a conductive material to create the selection transistor lines.

2. The method of claim 1, further comprising:
   selectively uncovering the substrate in a region of source lines to be prepared to create source line recesses running in the second direction; and
   filling the source line recesses with a conductive, metallic material to create the source lines.

3. The method of claim 1, further comprising:
   selectively uncovering the substrate in a region of bit line contacts to be prepared to create bit line recesses; and
   filling the bit line recesses with conductive, metallic material to create the bit line contacts.

4. A method of manufacturing a flash memory device comprising a NAND-array of floating gate memory cells comprising:
   providing a substrate of semiconductor material having a layer of dielectric material provided as a tunneling dielectric layer deposited on a main surface and having first conductive lines of electrically conductive material arranged on a tunneling oxide layer running in a first direction;
   depositing a layer of dielectric material provided as a coupling dielectric layer on the first conductive lines;
   depositing of electrically conductive material provided as a control gate layer;
   patterning the control gate layer in a second direction crossing the first direction to produce second conductive lines in a region of memory transistors and selection transistors to be prepared, thereby patterning the first conductive lines to produce gate stacks;

depositing dielectric material in between the gate stacks;

partially removing the gate stacks to uncover floating gate electrodes in regions of selection transistor lines to be prepared creating selection transistor line recesses running in the second direction; and filling the selection transistor line recesses with a conductive, metallic material to create the selection transistor lines.

5. The method of claim 4, further comprising:

selectively uncovering the substrate in a region of source lines to be prepared to create source line recesses running in the second direction; and filling the source line recesses with a conductive, metallic material to create the source lines.

6. The method of claim 4, further comprising:

selectively uncovering the substrate in a region of bit line contacts to be prepared to create bit line recesses; and filling the bit line recesses with conductive, metallic material to create the bit line contacts.

7. The method of claim 4, wherein the selection transistor line recesses and source line recesses are filled with conductive material at the same time.

8. The method of claim 4, wherein the first conductive lines provided in the substrate is prepared in a self-aligned manner.

9. A method of manufacturing a flash memory device comprising a NAND array of floating gate memory cells for producing selection transistor lines and source lines, comprising:

providing a substrate of semiconductor material having a layer of dielectric material provided as tunneling dielectric layer deposited on a main surface thereof and having first conductive lines of electrically conductive material arranged on a tunneling oxide layer running in a first direction;

depositing a layer of dielectric material provided as a coupling dielectric layer on the first conductive lines;

depositing of electrically conductive material as a control gate layer;

patterning the control gate layer in a second direction crossing the first direction to produce second conductive lines in regions of memory transistors, selection transistors and source lines to be prepared, thereby patterning the first conductive lines to produce gate stacks;

depositing of dielectric material in between the gate stacks;

partially removing the gate stacks to uncover floating gate electrodes in regions of selection transistor lines and source lines, respectively, to be prepared creating selection transistor line recesses and first source line recesses, respectively, running in the second direction;

totally removing the gate stacks to uncover the substrate in regions of source lines to be prepared creating second source line recesses running in the second direction; and filling the selection transistor line recesses and the second source line recesses with conductive metallic material to create the selection transistor lines and source lines.

10. The method of claim 9, further comprising:

selectively uncovering the substrate in a region of bit line contacts to be prepared to create bit line recesses;

filling the bit line contact recesses with conductive, metallic material to create the bit line contacts.

11. The method of claim 9, wherein the first conductive lines provided in the substrate are prepared in a self-aligned manner.

12. A method of manufacturing a flash memory device comprising a NAND array of floating gate memory cells, including producing selection transistor lines, source lines and bit line contacts, comprising:

providing a substrate of semiconductor material having a layer of dielectric material provided as tunneling dielectric layer deposited on a main surface thereof and having first conductive lines of electrically conductive material arranged on a tunneling oxide layer running in a first direction;

depositing a layer of dielectric material that is provided as coupling dielectric layer on the first conductive lines;

depositing of electrically conductive material provided as control gate layer;

patterning the control gate layer in a second direction crossing the first direction to produce second conductive lines in regions of memory transistors, selection transistors, source lines and bit line contacts to be prepared, thereby patterning the first conductive lines to produce gate stacks;

depositing of dielectric material in between the gate stacks;

partially removing the gate stacks to uncover floating gate electrodes in regions of selection transistor lines, source lines and bit line contacts, to be prepared creating selection transistor line recesses, first source line recesses and first bit line contact recesses, running in the second direction;

totally removing the gate stacks to uncover the substrate in regions of source lines and bit line contacts, respectively, to be prepared creating second source line recesses and second bit line contact recesses, respectively, running in the second direction; and filling the selection transistor line recesses, the second source line recesses and second bit line recesses, respectively, with conductive, in particular metallic material to create the selection transistor lines, source lines and bit line contacts, respectively.

13. The method of claim 12, wherein the first conductive lines provided in the substrate are prepared in a self-aligned manner.

14. The method of claim 4, wherein before the deposition of dielectric material in between the gate stacks comprising implanting one or more dopants into the substrate in between the gate stacks.

15. The method of claim 4, wherein before the filling of the selection transistor line recesses with conductive, metallic material to create the selection transistor lines comprising implanting one or more dopants into the floating gates.

16. The method of claim 5, wherein before the filling of the source line recesses with conductive, metallic material to create source lines comprising implanting one or more dopants into the substrate.

17. The method of claim 6, wherein before the filling of the bit line contact recesses with conductive, metallic material to create the bit line contacts comprising implanting one or more dopants into the substrate.

18. A method of manufacturing a flash memory device comprising:

a NAND array of floating gate memory cells the memory cells being arranged in NAND-strings, each NAND-string comprising a serial connection of floating gate memory transistors and at least one selection transistor for the selection thereof, the NAND-string being electrically interconnected between a bit line running in a first direction and a source line running in a second direction crossing the first direction, the floating gate memory transistors having control gate electrodes being in electric contact with word lines running in the second direction, the selection transistor having a control gate electrode being in electric contact with a selection transistor line being in parallel alignment to the word lines, the method comprising:

providing a substrate of semiconductor material having a layer of dielectric material provided as tunneling dielectric layer deposited on a main surface thereof and having lines of electrically conductive material provided as floating gate lines arranged on a tunneling oxide layer running in the first direction;

depositing a layer of dielectric material that is provided as coupling dielectric layer on the floating gate lines;

depositing at least one layer of electrically conductive material provided as control gate layer;

patterning the control gate layer in the second direction to produce word lines that provide control gate electrodes;

patterning the floating gate lines to produce gate stacks;

depositing a layer of dielectric material on the floating gate stacks to electrically isolate the floating gate stacks;

selectively uncovering floating gate electrodes in regions of selection transistor lines to be prepared creating a selection transistor line trench running in the second direction;

selectively uncovering the substrate in a region of source lines to be prepared to create source line trenches running in the second direction;

filling the selection transistor line trenches with conductive, in particular metallic material to create the selection transistor lines;

filling the source line trenches with metallic material to create the source lines;

depositing a layer of dielectric material at least on the selection transistor and source lines; and manufacturing of the bit lines, each one being in electric contact with at least one NAND-string.

* * * * *